(12) United States Patent
Takeuchi

(10) Patent No.: US 7,426,141 B2
(45) Date of Patent: Sep. 16, 2008

(54) SEMICONDUCTOR MEMORY DEVICE

(75) Inventor: Ken Takeuchi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 54 days.

(21) Appl. No.: 11/319,474

(22) Filed: Dec. 29, 2005

(65) Prior Publication Data

US 2006/0203547 A1    Sep. 14, 2006

(30) Foreign Application Priority Data

Mar. 9, 2005    (JP) .............................. 2005-064915

(51) Int. Cl.
*G11C 16/04*    (2006.01)
(52) U.S. Cl. ..................... 365/185.11; 365/185.09; 365/185.23
(58) Field of Classification Search ............ 365/185.11, 365/185.09, 185.23
See application file for complete search history.

(56) References Cited

U.S. PATENT DOCUMENTS

| 5,313,431 | A | * | 5/1994 | Uruma et al. | .......... | 365/230.05 |
|---|---|---|---|---|---|---|
| 5,781,478 | A | | 7/1998 | Takeuchi et al. | | |
| 5,920,507 | A | | 7/1999 | Takeuchi et al. | | |
| 6,069,823 | A | | 5/2000 | Takeuchi et al. | | |
| 6,147,911 | A | | 11/2000 | Takeuchi et al. | | |
| 6,172,911 | B1 | * | 1/2001 | Tanaka et al. | .......... | 365/185.22 |
| 6,307,785 | B1 | | 10/2001 | Takeuchi et al. | | |

* cited by examiner

*Primary Examiner*—Huan Hoang
(74) *Attorney, Agent, or Firm*—Oblon, Spivak, McClelland, Maier & Neustadt, P.C.

(57) ABSTRACT

A semiconductor memory device includes: first and second cell arrays each having electrically rewritable and non-volatile semiconductor memory cells arranged therein, the first and second cell arrays being disposed in the direction of each bit line for transferring cell data and physically independent of each other; a sense amplifier disposed between the first and second cell arrays to be common to them; and a decode circuit configured to select a memory cell in the first and second cell arrays in accordance with address assigned to the first and second cell arrays in such a way that the first and second cell arrays serve as one memory plane in logic.

17 Claims, 12 Drawing Sheets

SEMICONDUCTOR MEMORY DEVICE

CROSS-REFERENCE TO RELATED APPLICATION

This application is based on and claims the benefit of priority from the prior Japanese Patent Application No. 2005-064915, filed on Mar. 9, 2005, the entire contents of which are incorporated herein by reference.

BACKGROUND OF THE INVENTION

1. Field of the Invention

This invention relates to a semiconductor memory device (EEPROM) with electrically rewritable and non-volatile semiconductor memory cells.

2. Description of Related Art

A NAND-type flash memory is known as one of EEPROM flash memories, which has a feature that a large memory capacitance may be easily achieved because the unit cell area is small. The NAND-type flash memory usually has a page buffer for reading and writing data by a page, so that it is possible to do high rate read and write.

In general, to make a flash memory have a large capacitance, and to make it possible, if necessary, to execute data reading simultaneously with data writing, plural memory planes (i.e., memory cores) are disposed as independent of each other in the memory chip. Word lines and bit lines in one memory plane are not continued to those in the remaining memory plane(s). Therefore, there is provided a decode circuit for each memory plane for selecting row and column therein (refer to, for example, Unexamined Japanese Patent Application Publication No. 2001-325795).

A sense amplifier circuit for detecting bit line data of a flash memory is usually disposed at one side of the memory cell array in the direction of bit lines thereof. Therefore, as the cell array capacitance becomes larger, the bit line capacitance (i.e., sense amplifier load) becomes larger, and this leads to deterioration of high-speed performance of the memory.

SUMMARY OF THE INVENTION

According to an aspect of the present invention, there is provided a semiconductor memory device including:

first and second cell arrays each having electrically rewritable and non-volatile semiconductor memory cells arranged therein, the first and second cell arrays being disposed in the direction of each bit line for transferring cell data and physically independent of each other;

a sense amplifier disposed between the first and second cell arrays to be common to them; and a decode circuit configured to select a memory cell in the first and second cell arrays in accordance with address assigned to the first and second cell arrays in such a way that the first and second cell arrays serve as one memory plane in logic.

DETAILED DESCRIPTION OF THE EMBODIMENTS

Illustrative embodiments of this invention will be explained with reference to the accompanying drawings below.

Figure 1:
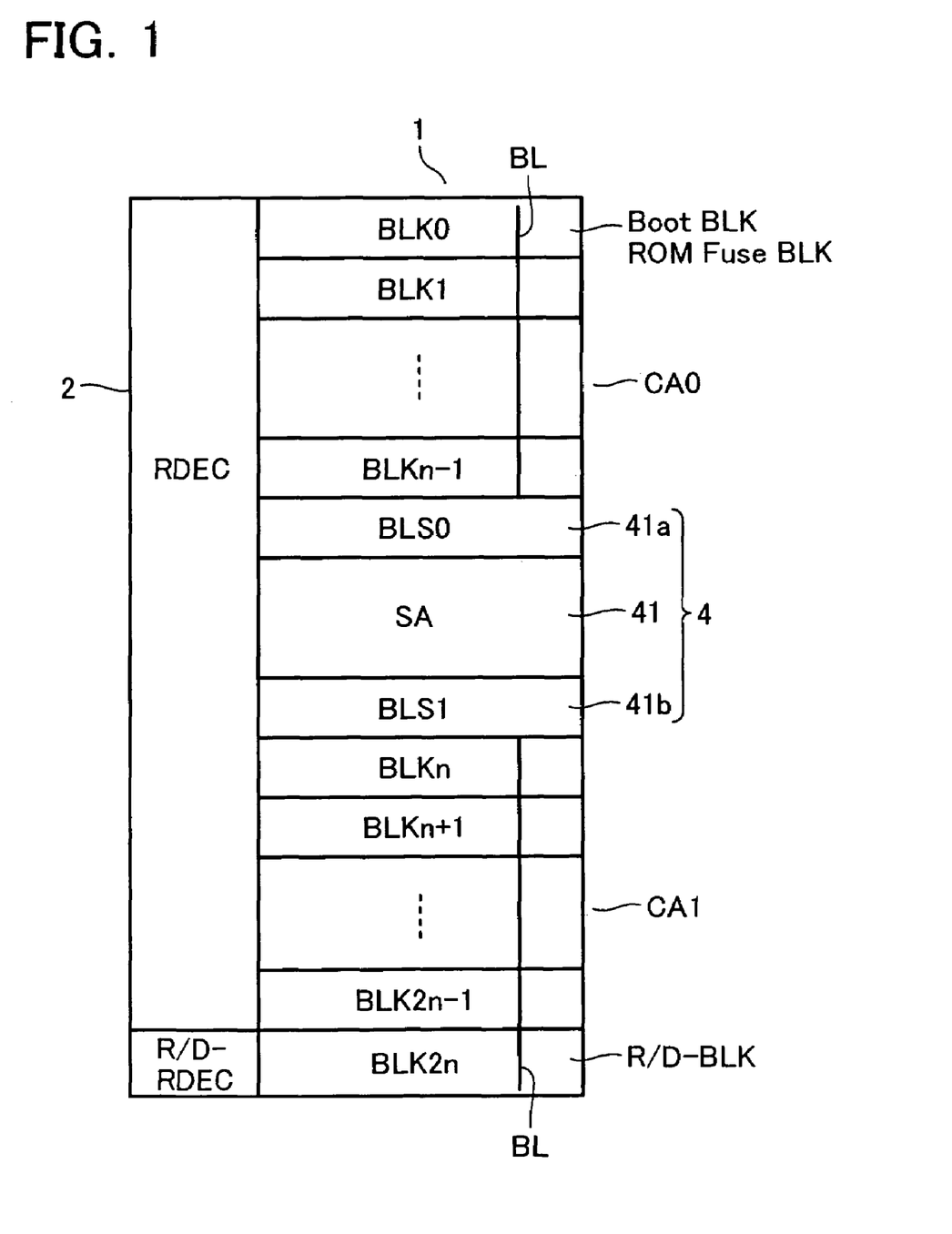
FIG. 1 shows a schematic memory core layout of a flash memory in accordance with an embodiment of the present invention.
Figure 2:
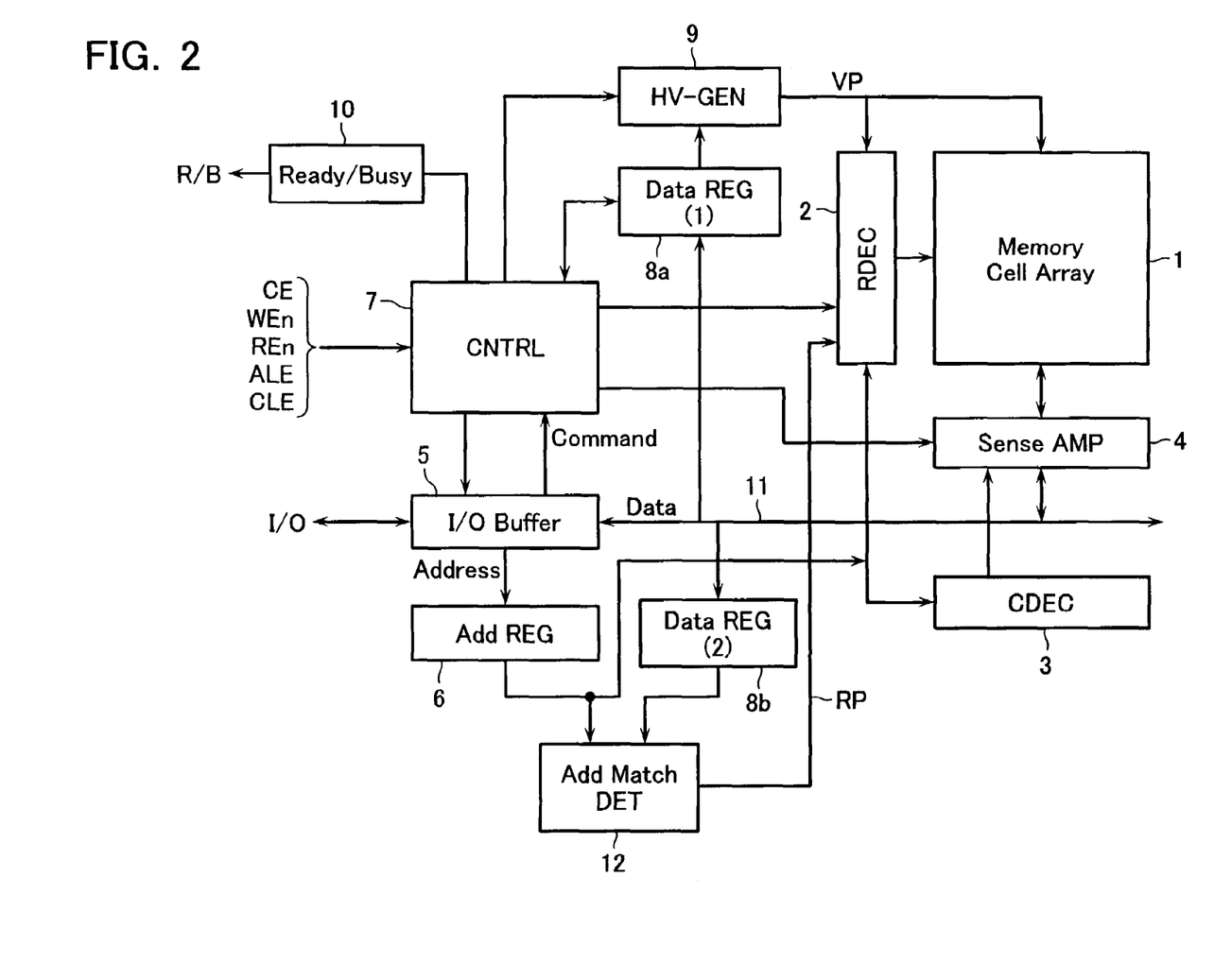
FIG. 2 shows a functional block configuration of the flash memory.

FIG. 1 shows a schematic layout of a memory core in a NAND-type flash memory in accordance with an embodiment. FIG. 2 shows a functional block configuration of the memory, and FIG. 3 shows an equivalent circuit of the memory cell array.

Figure 3:
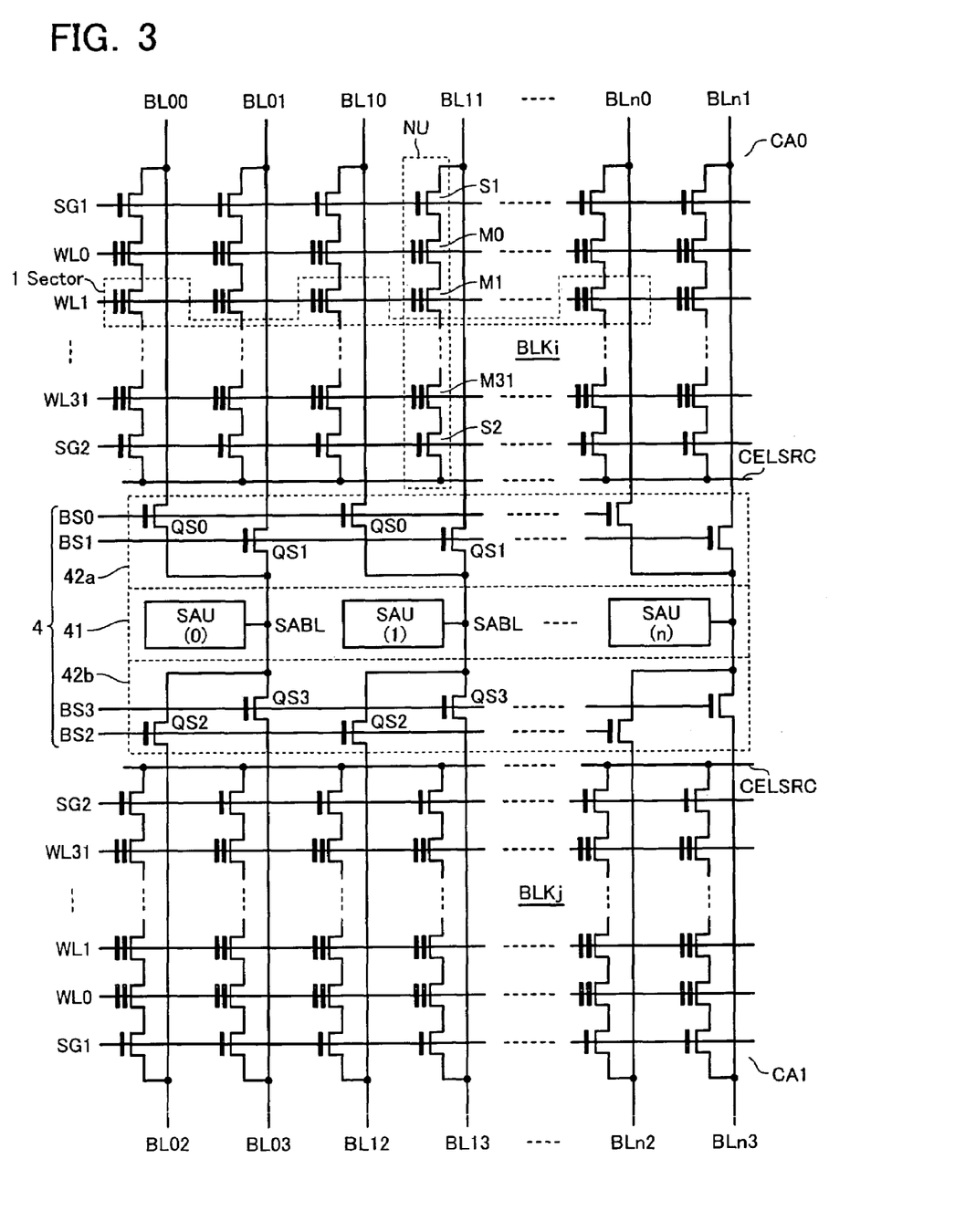
FIG. 3 shows a memory cell array arrangement of the flash memory.

The memory cell array 1 has, as shown in FIGS. 1 and 3, two cell arrays CA0 and CA1, which are disposed to sandwich and share a sense amplifier circuit 4. These two cell arrays CA0 and CA1 are independent of each other. That is, word lines and bit lines are not continued as covering these two cell arrays CA0 and CA1. Such the cell arrays CA0 and CA1 are arranged in the direction of the bit lines, and the shared sense amplifier circuit 4 is disposed therebetween.

The cell arrays CA0 and CA1 are constituted by plural blocks BLK0-BLKn-1 and BLKn-BLK2n, respectively. Disposed at one side of these cell arrays CA0 and CA1 in the direction of the word lines is a row decoder 2 for selecting a word line.

FIG. 3 shows a detailed configuration of the blocks BLKi and BLKj each disposed in the cell arrays CA0 and CA1. Each cell array is formed of NAND cell units, NU, arranged therein. Each NAND cell unit NU has a plurality of (i.e., thirty-two in the example shown in FIG. 3) electrically rewritable and non-volatile memory cells M0-M31 connected in series and select gate transistors S1 and S2 for coupling both ends thereof to bit line BL and source line CELSRC, respectively.

Control gates of the memory cells M0-M31 are coupled to different word lines WL0-WL31, respectively. Gates of the select gate transistors S1 and S2 are coupled to select gate lines SG1 and SG2, respectively, which are disposed in parallel with the word lines. A set of NAND cell units sharing a word line constitutes a block BLK, which serves as a unit of data erase.

Column decoder 3 is prepared for selecting bit lines in the memory cell array 1. At a data read time, read data in the sense amplifier circuit 4 are output to the external input/output terminals I/O via data bus 11 and I/O buffer 5. At a data write time, write data supplied to the external input/output terminals I/O from the external memory controller are loaded in the sense amplifier circuit 4 via the I/O buffer 5 and data bus 11.

Command supplied from the input/output terminals I/O is decoded in the internal controller 7, and address is transferred to row decoder 2 and column decoder 3 via an address register 6.

The controller 7 executes sequence control of data write and erase and data read control in response to external control signals and command, which are supplied in correspondence with operation modes.

Status register 10 is prepared for setting ready/busy signal R/B therein, which is output outside of the chip to designate whether the chip is in a ready state or a busy state. Disposed to generate various high voltages higher than the power supply voltage in accordance with operation modes is a high voltage generating circuit 9, which is under the control of the controller 7.

The sense amplifier circuit 4 has, as shown in FIG. 3, a sense amplifier array 41, in which sense amplifier units SAU are arranged, and bit line select circuits 42a and 42b, which select a connection state between each sense amplifier unit SAU and bit lines in the cell arrays CA0 and CA1.

Each of the sense amplifier units SAU(k)(k=0, 1, 2, ...) is coupled to either one of four bit lines BLk0-BLk3 (where BLk0 and BLk1 are adjacent to each other in the cell array CA0; and BLk2 and BLk3 are adjacent to each other in the cell array CA1). The bit line select circuit 42a and 42b have bit line select transistors QS0-QS3, which are driven by select signals BS0-BS3, respectively. One of these select transistors QS0-QS3 turns on so that even-numbered bit line BLk0 or odd-numbered bit line BLk1 in the cell array CA0, or even numbered bit line BLk2 or odd-numbered bit line BLk3 in the cell array CA1 is coupled to the sense amplifier unit SAU(k).

In the sense amplifier scheme shown in FIG. 3, only one of cell arrays CA0 and CA1 is selected. In each cell array, a set of memory cells selected by a word line and all even-numbered bit lines constitute a sector; and another set of memory cells selected by the word line and all odd-numbered bit lines constitute another sector. In case of binary storage scheme, one sector is used as a page serving as a unit of data read and write. In case of four-value data storage, one sector constitutes two pages (i.e., lower page and upper page).

In this embodiment, two cell arrays CA0 and CA1 sharing a sense amplifier circuit 4 as shown in FIG. 1 serve as one memory plane in logic, and a redundant circuit is disposed on either one of cell arrays CA0 and CA1 as being able to relieve a defective memory cell in both cell arrays CA0 and CA1. In the example shown in FIG. 1, block BLK2n disposed at the side of the cell array CA1 serves as a redundant circuit (i.e., redundant block) R/D-BLK.

Row decoder 2 has a normal row decoder RDEC used for selecting one of normal blocks BLK0-BLK2n-1 and a redundant row decoder R/D-DEC used for selecting the redundant block BLK2n.

Figure 4:
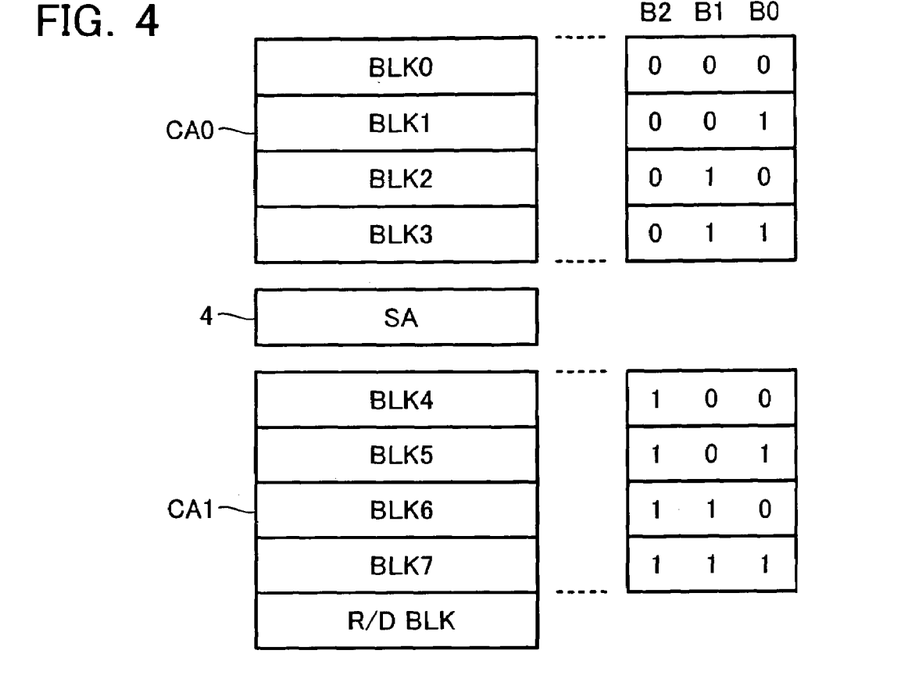
FIG. 4 shows a block address assignment scheme of the flash memory.

As described above, two cell arrays CA0 and CA1 serve as logical one memory plane, and this means that external logical address is continuously assigned to the two cell arrays CA0 and CA1. Supposing, for example, that each of cell arrays CA0 and CA1 has four blocks, block address BA=(B2, B1, B0) is defined as shown in FIG. 4.

Figure 5:
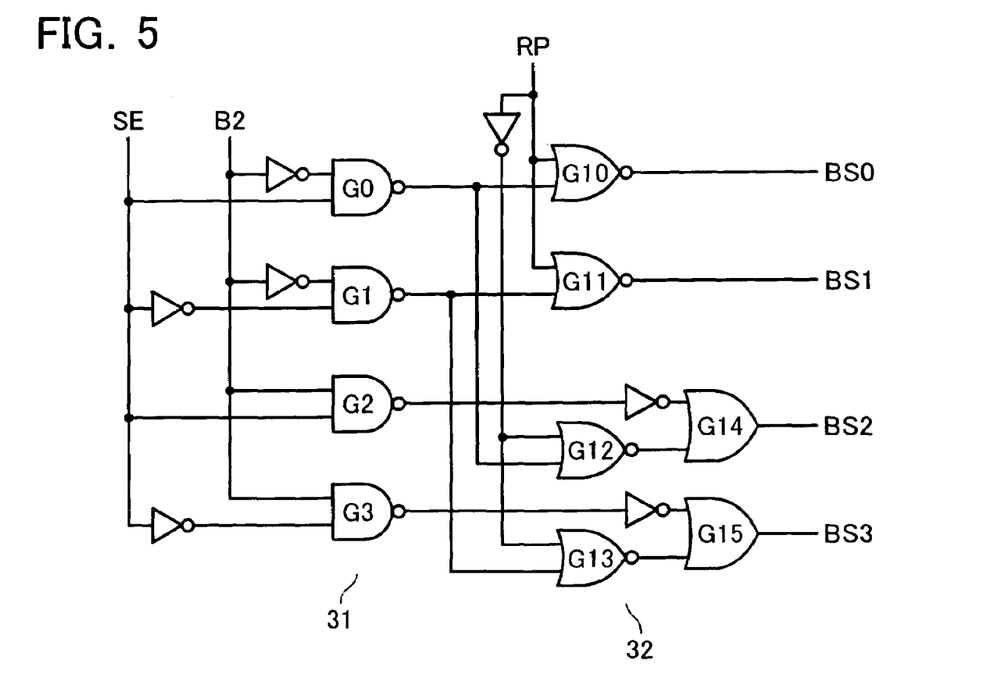
FIG. 5 shows a configuration of bit line select signal generation circuit of the flash memory.

The uppermost bit B2 of this block address BA designates which of cell arrays CA0 and CA1 is selected. Therefore, this uppermost bit B2 is, as shown in FIG. 5, applied to a bit line select signal generating circuit 31.

The signal generating circuit 31 has NAND gates G0-G3, one of which is activated based on a logic of the uppermost bit B2 and a sector select signal SE, so that either one of bit line select signals BS0-BS3 becomes "H" (select state).

In this embodiment, redundant block R/D-BLK disposed on the cell array CA1 side is used for relieving defects in the cell arrays CA0 and CA1. Therefore, to use the redundant block R/D-BLK in place of a selected block in the cell array CA0, it is required to change a connection state of the sense amplifier circuit 4. For this purpose, as shown in FIG. 5, disposed at the output portion of the select signal generating circuit 31 is a sense amplifier exchanging circuit 32, which has NOR gates G10-G13 disposed under the control of a replace control signal RP (this will be explained later) and OR gates G14 and G15.

In a case that cell array CA0 is selected and there is no defective block replacement, i.e., the replace control signal RP is "L", NOR gates G10 and G11 are active and either one of NAND gates G0 and G1 outputs "L", so that either one of select signals BS0 and BS1 becomes "H". By contrast, when a defective block is selected in the cell array CA0, NOR gates G12 and G13 become active. As a result, "L" output of NAND gate G0 or G1 is transferred through NOR gate G12 or G13 so that either one of select signals BS2 and BS3 becomes "H" for selecting bit lines in the cell array CA1 side.

In a case that cell array CA1 is selected and a defective block to be replaced is selected, there is no need of exchanging the sense amplifier connection. In this case, without regard to whether the replace control signal RP is "L" or "H", "L" output of NAND gate G2 or G3 is inverted in logic by an inverter and transferred via OR gate G14 or G15 so that select signal BS2 or BS3 becomes "H".

Although, in the example shown in FIG. 1, the number of normal blocks in both of cell arrays CA0 and CA1 is "n", and one redundant block R/D-BLK is prepared for 2×n normal blocks, it is permitted to set the normal block numbers of cell arrays CA0 and CA1 to be different from each other. Further, it is possible to prepare two or more redundant blocks.

One block, e.g., block BLK0 as shown in FIG. 1, is used as an initial set-up data storage area (i.e., boot block or ROM fuse block) in one of the two cell arrays CA0 and CA1 constituting a memory plane. In this block BLK0, an initial set-up data is written before shipping, which is set in a desired condition for each memory chip. As the initial set-up data, there are voltage trimming data for adjusting write voltage and so on, loop numbers (write cycle numbers) trimming data, other information necessary for starting-up the system and defining the operation condition, defective address information used for replacing a defective cell, chip information and the like.

The initial set-up data are, for example, automatically read out after power-on and set in data registers 8a and 8b. For example, data register 8a is for storing various trimming data (i.e., adjustment data); and data register 8b for storing defective address.

Memory operation condition is defined by the initial set-up stored in the data register 8a. Address match detecting circuit 12 detects that input address is identical with the defective address stored in the data register 8b, and outputs the replace control signal RP="H". This replace control signal RP is, for example, used for making the normal row decoder portion RDEC in the row decoder 2 inactive, and making the redundant row decoder R/D-DEC active in place of the normal row decoder.

Figure 6:
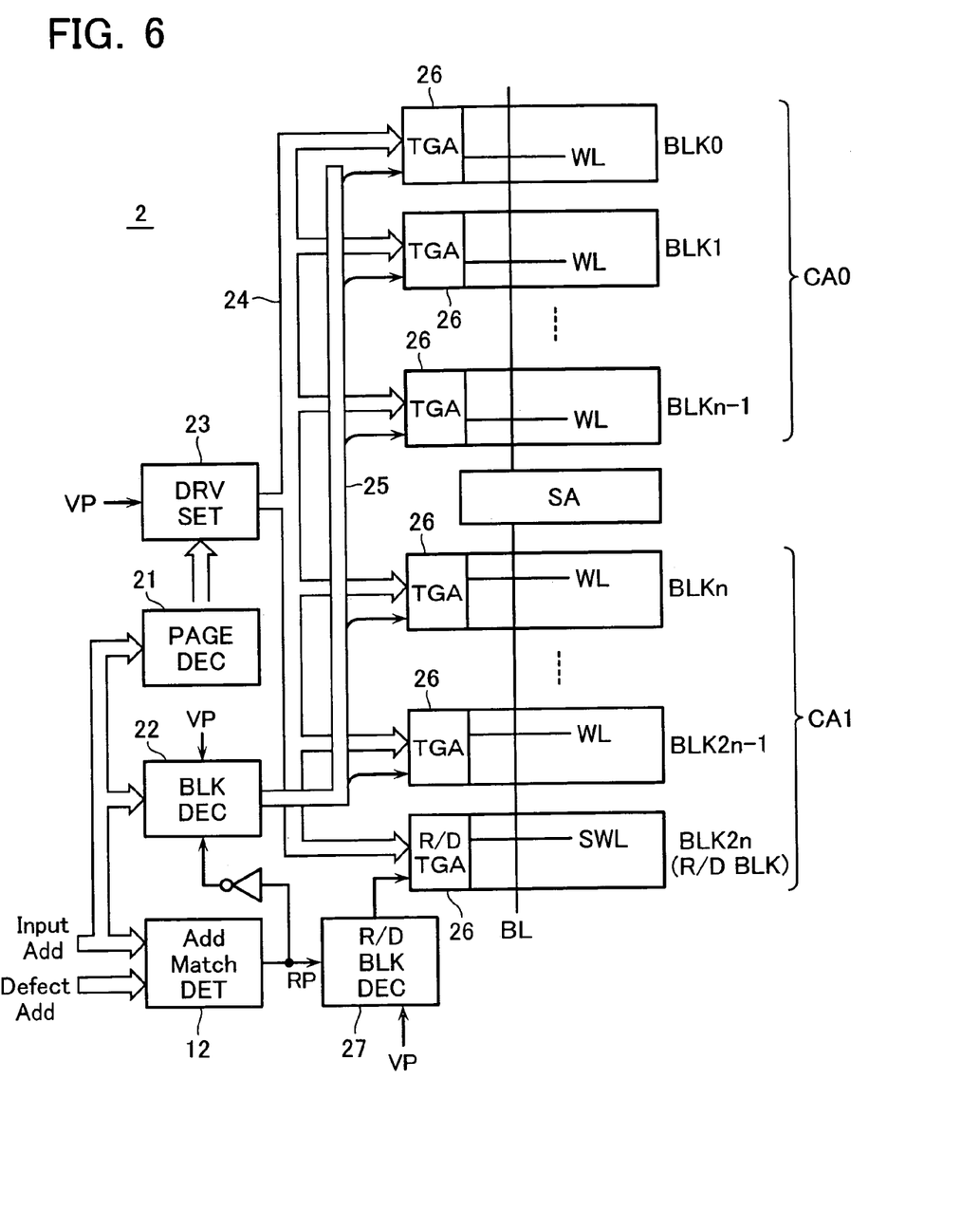
FIG. 6 shows a row decoder of the flash memory.
Figure 7:
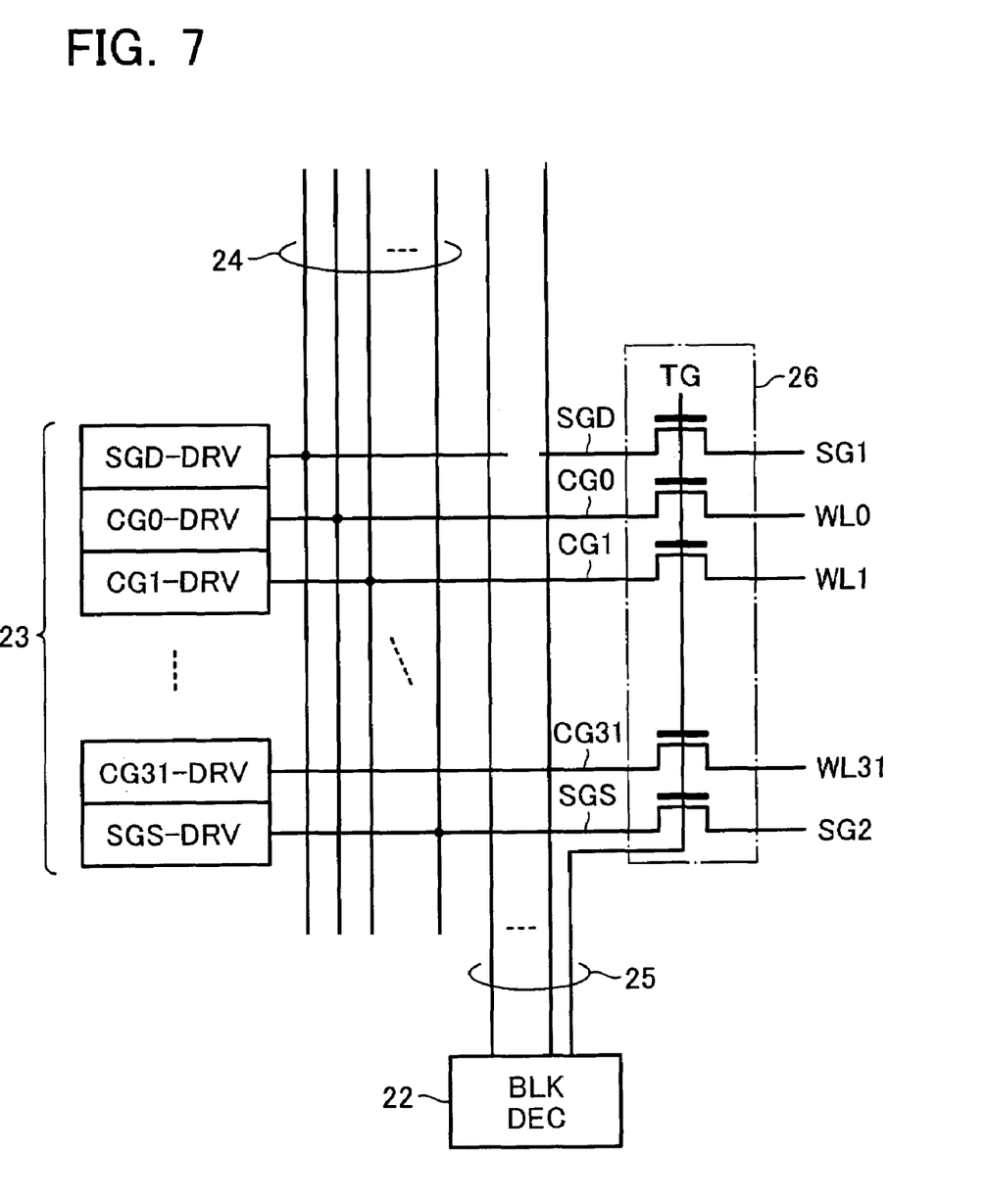
FIG. 7 shows a detailed configuration of the row decoder.

FIGS. 6 and 7 show a detailed configuration of the row decoder 2, which is made possible to deal with two cell arrays CA0 and CA1 as a logical one memory plane. The row decoder 2 has transferring transistor arrays 26, which are disposed for every block in the cell arrays CA0 and CA1 at one end portion in the direction of the word line to transfer drive signals required in accordance with operation modes to the word lines and select gate lines. Each transferring transistor array 26 is formed of high-breakdown voltage transistors, each of which bears with, for example, write voltage Vpgm of about 20V.

Driver set 23 is disposed common to the entire blocks in the cell arrays CA0 and CA1 and has select gate line drivers SGD-DRV and SGS-DRV for driving select gate lines SG1 and SG1, respectively, and word line drivers CG0-DRV~CG31-DRV for driving word lines WL0~WL31, respectively.

Each driver in the driver set 23 outputs a drive voltage, which is necessary for an operation mode and in accordance with a selected page, in response to a decode output of page decoder 21 and a high voltage VP generated from the high voltage generation circuit 9 to each of drive signal lines 24, and it will be supplied to the transferring transistor arrays 26 of the entire blocks in cell arrays CA0 and CA1.

A block decoder 22 is for decoding block address to select a transferring transistor array 26 in the entire blocks. Since the high voltage VP generated from the high voltage generation circuit 9 is applied to this block decoder 22, it generates a block select signal with a voltage level necessary for driving the transferring transistor array 26 in accordance with an operation mode. Block select signal lines 25, which are output lines of the block decoder 22, are coupled to common gate terminals TG of the transferring transistor arrays 26 in the blocks BLK0-BLK2n-1, respectively.

With the above-described configuration, driver signal voltages generated from the driver set 23 are applied to word lines and select gate lines in a block selected by the block decoder 22.

The transferring transistor array 26 in the redundant row block BLK2n disposed at the cell array CA1 side is driven by redundant block decoder 27, which are activated by the replace control signal RP output from the address match detecting circuit 12. In detail, when a defective address is input, the replace control signal RP="H" is output so that the block decoder 22 becomes inactive, and the redundant block decoder 27 becomes active in place of it. As a result, the redundant block BLK2n is selected in place of a defective block.

Figure 8:
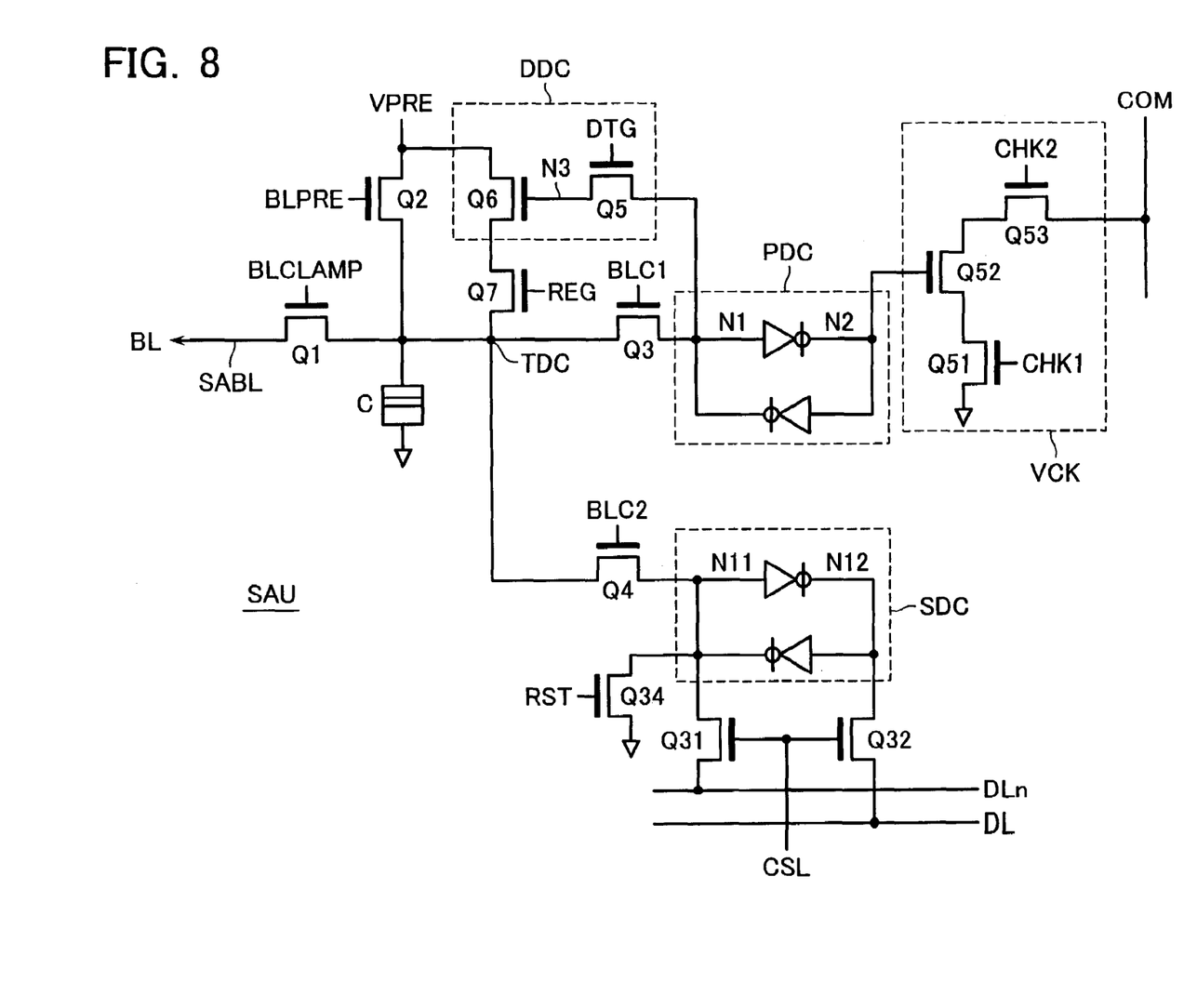
FIG. 8 shows a sense amplifier unit of the flash memory.

FIG. 8 shows a detailed configuration of a sense amplifier unit SAU in the sense amplifier circuit 4. Node SABL, which is to be coupled to a bit line BL via the bit line select circuits 41a and 41b, is connected to a sense node TDC via a clamping NMOS transistor Q1. This transistor Q1 serves for clamping the bit line voltage and serves as a pre-sense amplifier for detecting bit line voltage defined by cell data at a data read time; and serves for transferring a voltage defined by write data to a bit line at a data write time.

Further connected to the sense node TDC is a precharging NMOS transistor Q2, which serves for precharging the bit line to a certain voltage at a data read time.

Two data storage circuits (data latches) PDC and SDC are coupled to the sense node TDC via transferring NMOS transistors Q3 and Q4, respectively. These data storage circuits PDC and SDC are adaptively used in accordance with operation modes. For example, the data storage circuit SDC is used as a data cache, which serves for transmitting/receiving read/write data between itself and an external input/output terminal I/O. Therefore, data nodes N11 and N12 thereof are coupled to data lines DLn and DL via column select gate transistors Q31 and Q32, respectively.

In contrast to this, the data storage circuit PDC is used for holding write data, which defines a bit line voltage, at a data write time. In detail, at the data write time, write data supplied from the external is loaded in the data storage circuit SDC, and then transferred to and held in the data storage circuit PDC.

Bit line control voltage will be determined based on the write data held in the data latch PDC, and channel voltage of the NAND cell unit will be determined by the bit line voltage. After having set the channel voltage, write cycles are performed by repeat of write voltage application and verify-read for verifying the write state. Further, the data storage circuit PDC stores read data read out to the sense node TDC at a data read time.

In each write cycle, write-verify is performed by a bit, thereby determining write data in the following write cycle. For the purpose of this, there is provided another data storage circuit DDC disposed between a data node N1 and sense node TDC for temporarily storing write data. Gate N3 of NMOS transistor Q6 serves as a data storage node of this data storage circuit DDC.

Disposed between the data node N1 and data storage node N3 is a transferring NMOS transistor Q5, which is used for transferring data of the node N1 to the storage node N3. Disposed between the transistor Q6 and the sense node TDC is a writing-back NMOS transistor Q7, which is used for writing back data to the sense node TDC in accordance with a level at the storage node N3.

To detect write completion of one page data based on the result of write-verify read, a verify-check circuit VCK is prepared.

With giving attention to the above-described sense amplifier unit, operations of the flash memory in accordance with this embodiment will be explained in brief bellow.

Data write is performed by repeat of write voltage application and write-verify. At a data write time, write data in the data storage circuit PDC is set as follows: "0" write data, which makes a cell have a threshold voltage shifted in the positive direction, is set as N1="H"; and "1" write data (i.e., write-inhibiting), which makes a cell maintain a negative threshold voltage state (i.e., erased state) as it is, is set as N1="L". Based on this write data, a NAND cell channel is controlled in potential. Thereafter, when boosted write voltage Vpgm is applied to a selected word line, electrons are injected into the floating gate in a "0" write cell while electron injection will not occur in a "1" write cell.

At a write-verify read time, "verify-voltage", which is equal to the lowest value of a data threshold distribution to be verified, is applied to the selected word line, and it is detected whether a precharged bit line is discharged or not via a selected cell. "0" write cell is not turned on with applying the verify-voltage to the selected word line, thereby resulting in that the bit line is not discharged. In this case, data is sensed as TDC="H", and this becomes "1" write data (i.e., write-inhibiting) hereinafter.

By contrast, when "0" write is incomplete or "1" write is performed, the corresponding bit line will be discharged, and this state is sensed as "L" data. In this case, write data of the next write cycle is written-back to the data storage circuit PDC based on the preceding write data stored in the data storage circuit DDC in such a way that "0" write is performed again only to cell(s) with incomplete "0" write performed.

The data storage circuits PDC in a page are controlled to designate a state where the entire data nodes N1 thereof become "H" (i.e., all "1" data state) when all "0" write data in a page have been completely written. To detect such the all "1" data state of the data storage circuits PDC in a page and judge write completion, the verify-check circuit VCK is connected to the data storage circuit PDC.

To read data, it is detected whether cell current is carried or not with applying a read voltage (e.g., 0V) to a selected word line in a selected block and a read pass voltage to non-selected word lines, which is able to turn on cells without regard to cells' data. Usually, selected bit lines are precharged, and then it is detected whether the precharged bit lines are discharged or not via selected cells so that read data are judged. Read data is stored in the data storage circuit PDC. Write-verify read is the same as the normal data read except that verify-voltage is used as described above in place of the read voltage.

The above-described write/read operations with the data storage circuit PDC is basically adaptable to both of binary data storage scheme and four-value data storage scheme. In either scheme, the above-described write operation, i.e., "0" write for boosting the threshold voltage and "1" write (write inhibiting) for maintaining the threshold state are used, and Data read is performed with "0", "1" judgment.

In the binary data storage scheme, there is prepared at least one of the data storage circuits PDC and SDC so that data write and read may be performed. By contrast, in the four-value data storage scheme, it is necessary to do upper page write and lower page write for storing two bits per cell. Therefore, it is vital to use both the data storage circuits PDC and SDC.

As described above, according to this embodiment, two cell arrays, which are disposed adjacent to each other in the bit line direction, share a sense amplifier circuit disposed therebetween so that these cell arrays constitute a memory plane in logic. In a conventional flash memory, bit lines are continued in a memory plane, and a sense amplifier circuit is disposed at one end of the bit lines. Therefore, the larger the memory plane capacity, the larger the bit line capacitance, and this deteriorates the high-speed performance of data write and read. By contrast, in this embodiment, one memory plane is constituted by two cell arrays, which are physically independent of each other. Therefore, supposing that the memory capacity is the same as the conventional case, the bit line capacitance is reduced to be about a half of that in the conventional case, thereby achieving a high-speed performance.

Further, since two cell arrays constitute logical one memory plane, the redundant circuit may be disposed at one side of the cell arrays, which is able to relieve a defective memory cell for both two cell arrays. In addition, the initial set-up data is stored only in one cell array, thereby becoming possible to initialize the operation conditions of the memory chip.

Figure 9:
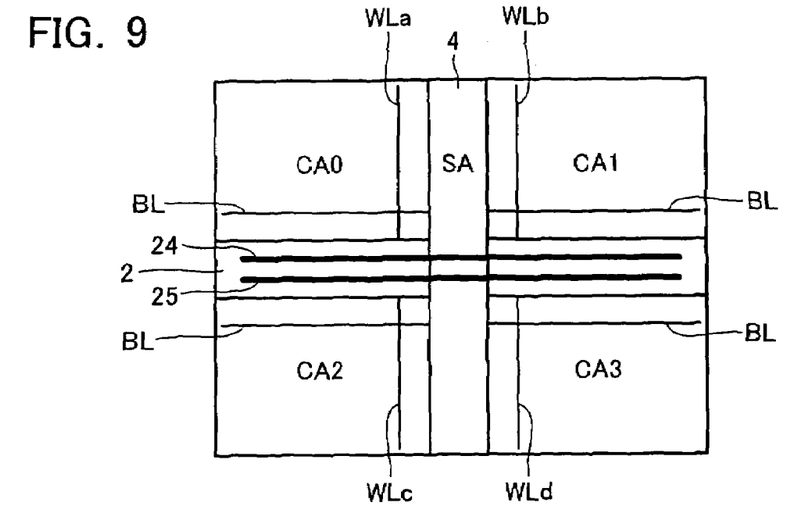
FIG. 9 shows a memory core layout of a flash memory in accordance with another embodiment.

FIG. 9 shows a schematic layout of a memory core in accordance with another embodiment with a memory capacitance larger than the above-described embodiment with the same reference symbols as in FIG. 1. In this embodiment, it should be noted that not only cell arrays (CA0, CA2) and (CA1, CA3) share the sense amplifier circuit 4, but also cell arrays (CA0, CA1) and (CA2, CA3) share the row decoder 2.

In this case, driving signal lines 24 and block select lines 25 are disposed to be continued as crossing the area of the sense amplifier circuit 4. With this configuration, it is possible to deal with four cell arrays CA0-CA3 as one memory plane.

As similar to the above-described embodiment, cell arrays (CA0, CA2) and (CA1, CA3), which shares the sense amplifier circuit 4, are not subjected to read or write simultaneously. In other words, in FIG. 9, word line WLa in the cell array CA0 and word line WLb in the cell array CA1 are not activated simultaneously, and word line WLc in the cell array CA2 and word line WLd in the cell array CA3 are not activated simultaneously.

In contrast to this, the word line WLa in the cell array CA0 and the word line WLc in the cell array CA2 may be activated simultaneously, and the word line WLb in the cell array CA1 and the word line WLd in the cell array CA3 may be activated simultaneously.

According to this embodiment, the word line length becomes to be substantially equal to a half of that of the above-described embodiment. Therefore, it may be provided a large capacitive flash memory with reduction of the word line capacitance in addition to reduction of the bit line capacitance. In case the word line capacitance is reduced, the word line voltage may be changed at a high speed, thereby providing a memory device with a high speed read and write performance.

Figure 10:
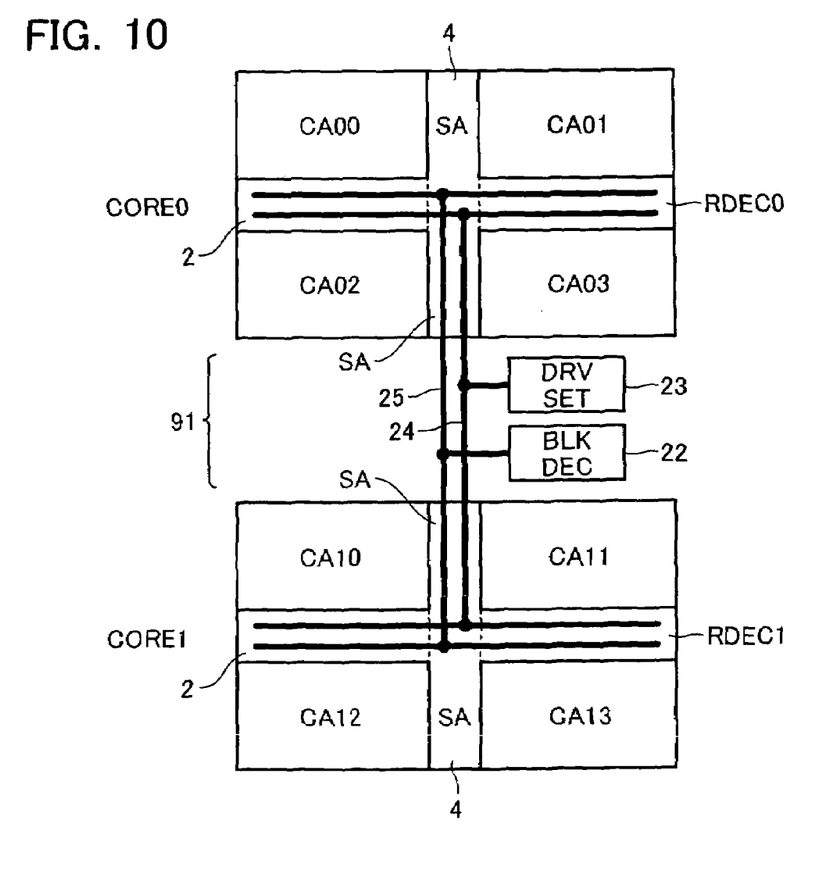
FIG. 10 shows a memory core layout of a flash memory in accordance with still another embodiment.

FIG. 10 shows a schematic layout of two memory cores CORE0 and CORE1 in accordance with another embodiment, each of which has the same configuration as in FIG. 9. Driver set 23 and block decoder 22, which are common to the entire blocks, are disposed on a peripheral circuit area 91 sandwiched between two memory cores CORE0 and CORE1. Drive signal lines 24 and block select lines 25, which are output lines of the driver set 23 and block decoder 22, are drawn to the row decoders 2 formed at central portions in the memory cores CORE0 and CORE1 via the area of sense amplifier circuit 4.

According to this embodiment, it may be provided a large capacitive flash memory with a high rate performance.

Figure 11:
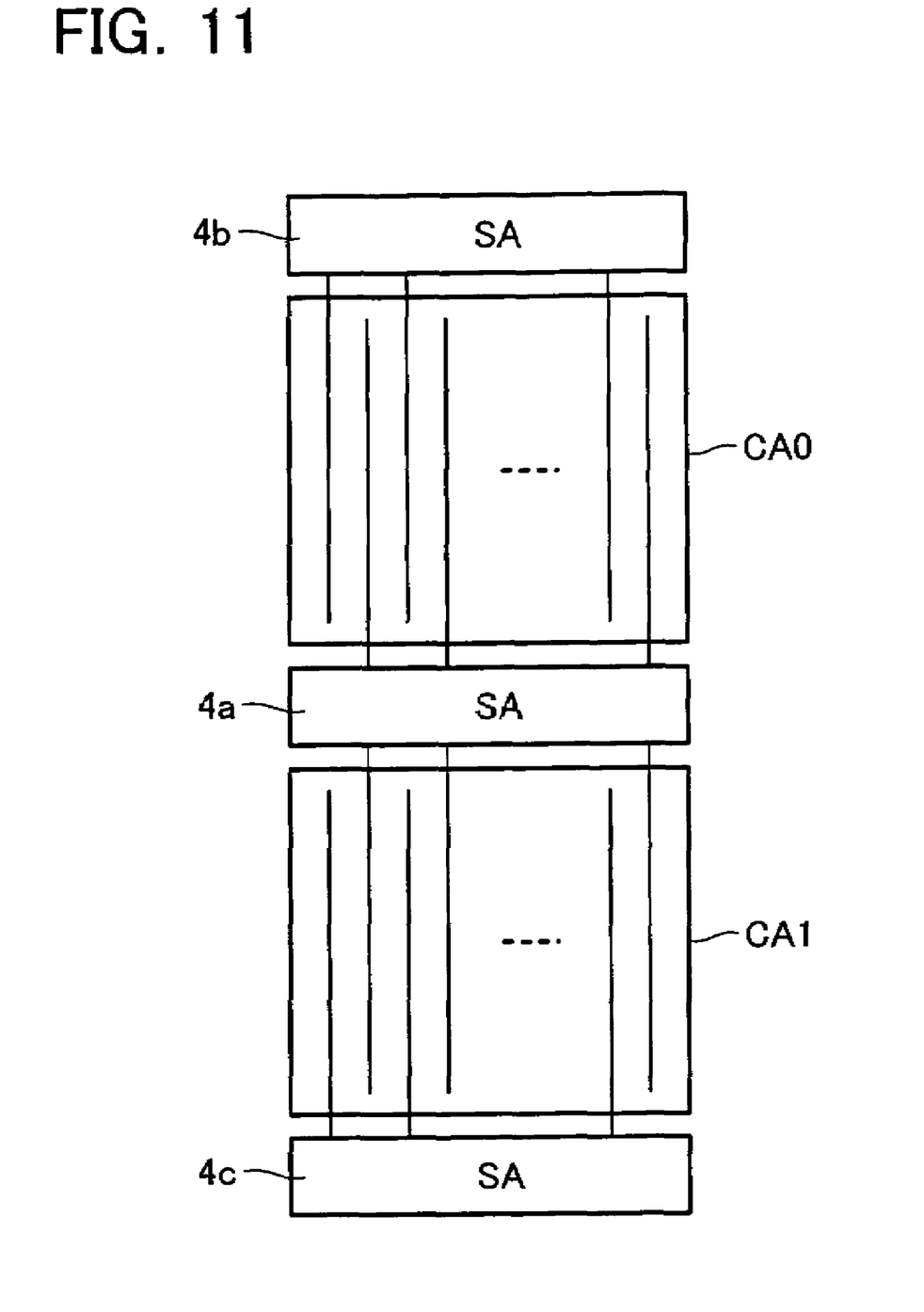
FIG. 11 shows a sense amplifier circuit layout of a flash memory in accordance with another embodiment.

FIG. 11 shows another embodiment, in which sense amplifier circuits 4 (4a, 4b and 4c) are dispersedly disposed for two cell arrays CA0 and CA1. For example, to the sense amplifier circuit 4a, which are disposed between the cell arrays CA0 and CA1 to be common to them, odd bit lines of the cell arrays CA0 and CA1 are coupled. Sense amplifier circuits 4b and 4c, to which even bit lines of the cell arrays CA0 and CA1 are coupled respectively, are disposed opposite to the sense amplifier circuit 4a.

The above-described arrangement of the sense amplifier circuits is effective in such a case that it becomes difficult to dispose all sense units between the cell arrays CA0 and CA1 as a result of the bit line pitch miniaturization.

As an embodiment, an electric card using the non-volatile semiconductor memory devices according to the above-described embodiments 1-3 of the present invention and an electric device using the card will be described bellow.

Figure 12:
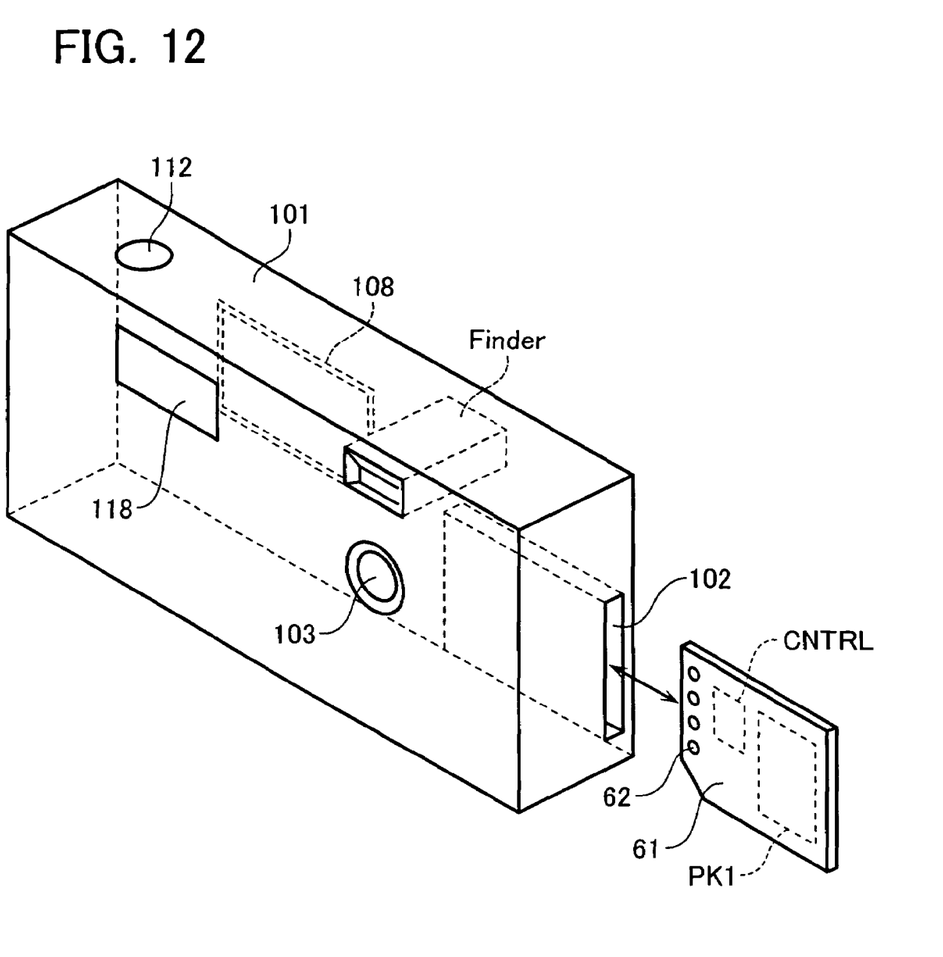
FIG. 12 shows another embodiment applied to a digital still camera.

FIG. 12 shows an electric card according to this embodiment and an arrangement of an electric device using this card. This electric device is a digital still camera 101 as an example of portable electric devices. The electric card is a memory card 61 used as a recording medium of the digital still camera 101. The memory card 61 incorporates an IC package PK1, in which the non-volatile semiconductor memory device or the memory system according to the above-described embodiments is integrated or encapsulated, and a memory controller CNTRL. Disposed on the surface of the memory card 61 are terminals, which are to be connected to those of the camera 101. Command, address and data are input to the terminal(s) 61 and transferred to IC package PK1 via the memory controller CNTRL.

The case of the digital still camera 101 accommodates a card slot 102 and a circuit board (not shown) connected to this card slot 102. The memory card 61 is detachably inserted in the card slot 102 of the digital still camera 101. When inserted in the slot 102, the memory card 61 is electrically connected to electric circuits of the circuit board.

If this electric card is a non-contact type IC card, it is electrically connected to the electric circuits on the circuit board by radio signals when inserted in or approached to the card slot 102.

Figure 13:
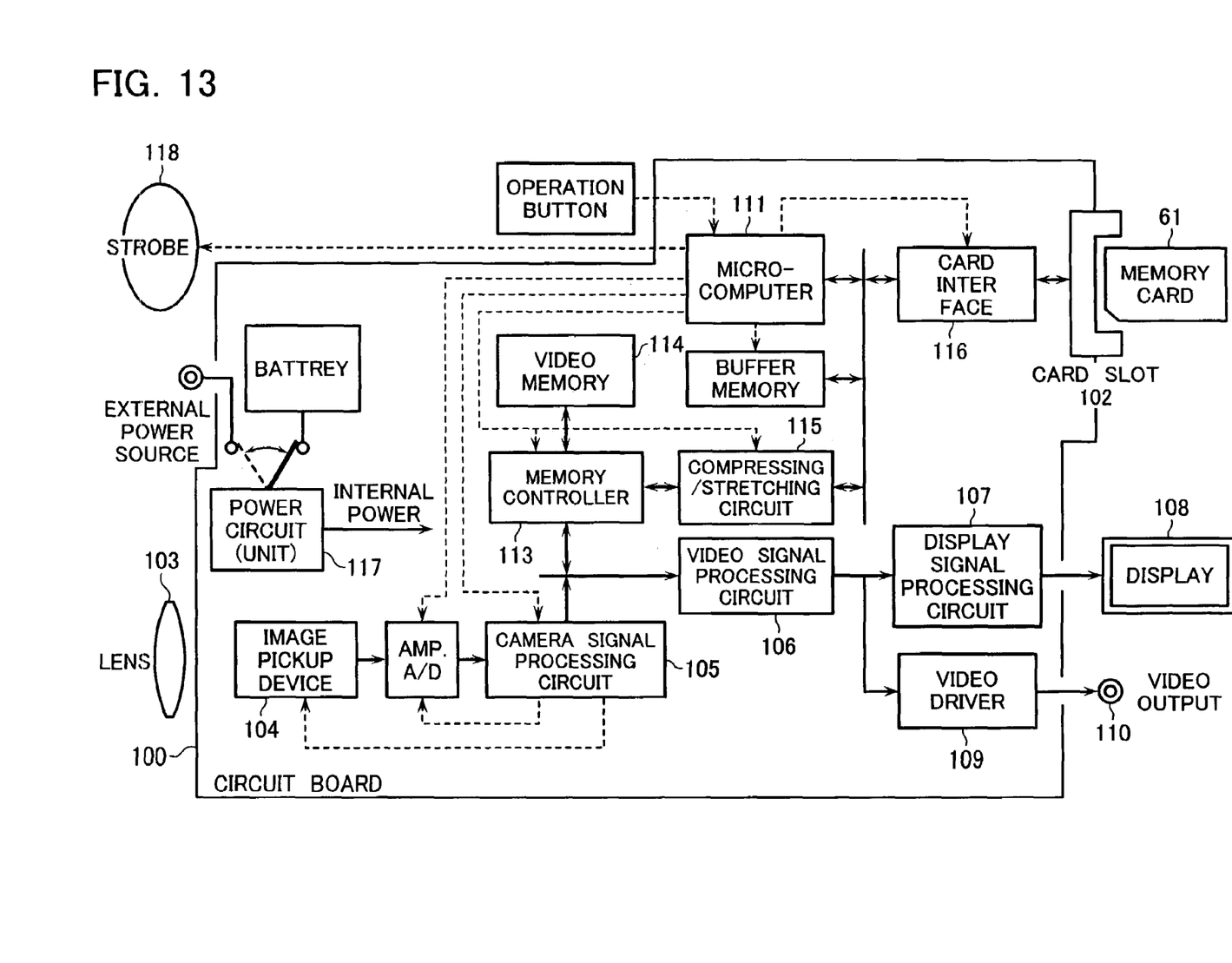
FIG. 13 shows the internal configuration of the digital still camera.
Figure 14A:
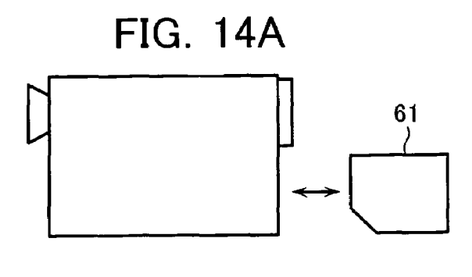
FIGS. 14A to 14J show other electric devices to which the embodiment is applied.
Figure 14B:
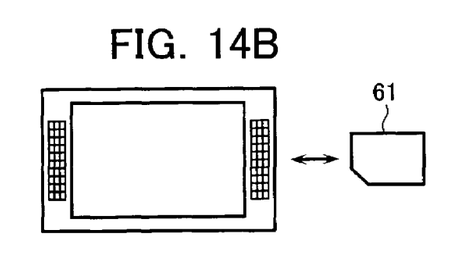
Figure 14C:
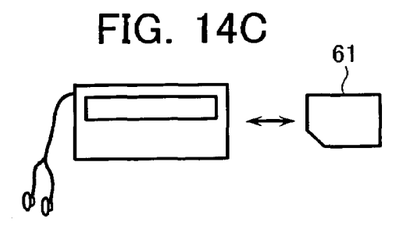
Figure 14D:
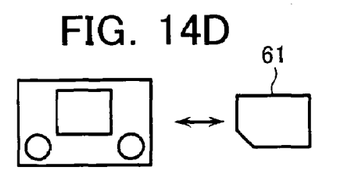
Figure 14E:
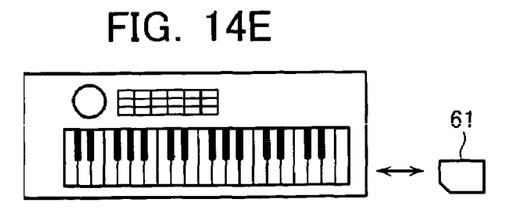
Figure 14F:
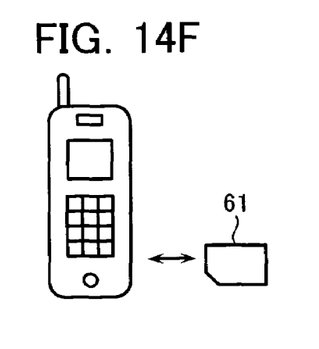
Figure 14G:
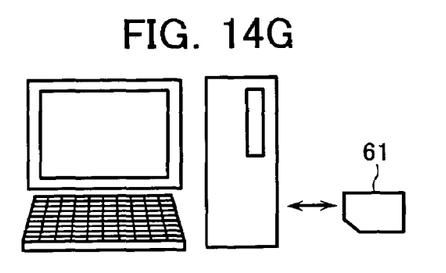
Figure 14H:
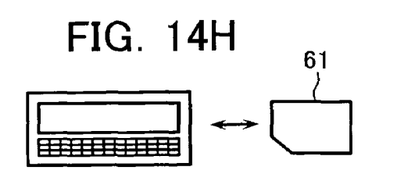
Figure 14I:
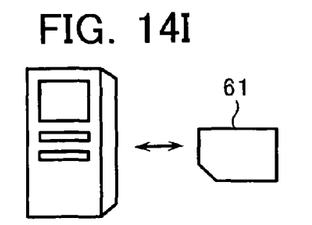
Figure 14J:
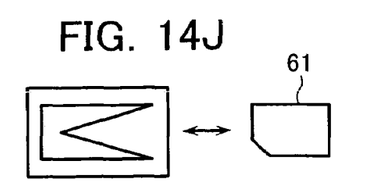

FIG. 13 shows a basic arrangement of the digital still camera. Light from an object is converged by a lens 103 and input to an image pickup device 104. The image pickup device 104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 105 where the signal is subjected to automatic exposure control (AE), automatic white balance control (AWB), color separation, and the like, and converted into a luminance signal and color difference signals.

To monitor the image, the output signal from the camera processing circuit 105 is input to a video signal processing circuit 106 and converted into a video signal. The system of the video signal is, e.g., NTSC (National Television System Committee). The video signal is input to a display 108 attached to the digital still camera 101 via a display signal processing circuit 107. The display 108 is, e.g., a liquid crystal monitor.

The video signal is supplied to a video output terminal 110 via a video driver 109. An image picked up by the digital still camera 101 can be output to an image apparatus such as a television set via the video output terminal 110. This allows the pickup image to be displayed on an image apparatus other than the display 108. A microcomputer 111 controls the image pickup device 104, analog amplifier (AMP), A/D converter (A/D), and camera signal processing circuit 105.

To capture an image, an operator presses an operation button such as a shutter button 112. In response to this, the microcomputer 111 controls a memory controller 113 to write the output signal from the camera signal processing circuit 105 into a video memory 114 as a flame image. The flame image written in the video memory 114 is compressed on the basis of a predetermined compression format by a compressing/stretching circuit 115. The compressed image is recorded, via a card interface 116, on the memory card 61 inserted in the card slot.

To reproduce a recorded image, an image recorded on the memory card 61 is read out via the card interface 116, stretched by the compressing/stretching circuit 115, and written into the video memory 114. The written image is input to the video signal processing circuit 106 and displayed on the display 108 or another image apparatus in the same manner as when image is monitored.

In this arrangement, mounted on the circuit board 100 are the card slot 102, image pickup device 104, analog amplifier (AMP), A/D converter (A/D), camera signal processing circuit 105, video signal processing circuit 106, display signal processing circuit 107, video driver 109, microcomputer 111, memory controller 113, video memory 114, compressing/stretching circuit 115, and card interface 116.

The card slot 102 need not be mounted on the circuit board 100, and can also be connected to the circuit board 100 by a connector cable or the like.

A power circuit 117 is also mounted on the circuit board 100. The power circuit 117 receives power from an external power source or battery and generates an internal power source voltage used inside the digital still camera 101. For example, a DC-DC converter can be used as the power circuit 117. The internal power source voltage is supplied to the respective circuits described above, and to a strobe 118 and the display 108.

As described above, the electric card according to this embodiment can be used in portable electric devices such as the digital still camera explained above. However, the electric card can also be used in various apparatus such as shown in FIGS. 14A to 14J, as well as in portable electric devices. That is, the electric card can also be used in a video camera shown in FIG. 14A, a television set shown in FIG. 14B, an audio apparatus shown in FIG. 14C, a game apparatus shown in FIG. 14D, an electric musical instrument shown in FIG. 14E, a cell phone shown in FIG. 14F, a personal computer shown in FIG. 14G, a personal digital assistant (PDA) shown in FIG. 14H, a voice recorder shown in FIG. 14I, and a PC card shown in FIG. 14J.

This invention is not limited to the above-described embodiment. It will be understood by those skilled in the art that various changes in form and detail may be made without departing from the spirit, scope, and teaching of the invention.

What is claimed is:

1. A semiconductor memory device comprising:
   first and second cell arrays each having electrically rewritable and non-volatile semiconductor memory cells arranged therein, said first and second cell arrays being disposed in the direction of each bit line for transferring cell data and physically independent of each other;
   a sense amplifier disposed between said first and second cell arrays to be common to them; and
   a decode circuit configured to select a memory cell in said first and second cell arrays in accordance with address assigned to said first and second cell arrays in such a way that said first and second cell arrays serve as one memory plane in logic, wherein
   said first and second cell arrays each comprises plural blocks, each block including plural word lines, and wherein
   said decode circuit comprises:
      transferring transistor arrays each disposed on one side of the word line direction of a block in each of said first and second cell arrays for transferring word line drive voltages in the block;
      a block decoder configured to decode block address for selectively driving one of the transferring transistor arrays;
      a set of word line drivers disposed common to the entire blocks of said first and second cell arrays for outputting the word line drive voltages to be applied to word lines in a selected block; and
      drive signal lines disposed for transferring the word line drive voltages from the word line drivers to the respective transferring transistor arrays.

2. The semiconductor memory device according to claim 1, further comprising:
   a redundant block disposed on either one of said first and second cell arrays to relieve a defective memory cell in said first and second cell array; and
   a redundant block decoder disposed to be so activated in place of the block decoder in response to defective address input as to drive a transferring transistor array disposed in correspondence with the redundant block.

3. The semiconductor memory device according to claim 1, wherein
   said sense amplifier circuit comprises:
      a sense amplifier array having a plurality of sense amplifier units arranged therein, each sense amplifier unit being selectively coupled to one of bit lines in said first and second cell arrays; and
      a bit line select circuit configured to select a coupling state between the sense amplifier units and bit lines in said first and second cell arrays.

4. The semiconductor memory device according to claim 1, further comprising third and fourth cell arrays disposed in the word line direction of said first and second cell arrays, respectively, said third and fourth cell arrays sharing said decode circuit with said first and second cell arrays, and wherein
said sense amplifier circuit is disposed between said third and fourth cell arrays to be common to them.

5. The semiconductor memory device according to claim 4, further comprising a plurality of memory cores, each of which is constituted by said first to fourth cell arrays, said decode circuit and sense amplifier circuit each shared by said first to fourth cell arrays.

6. The semiconductor memory device according to claim 1, wherein
each of said first and second cell arrays is formed of plural NAND cell units arranged therein, each NAND cell unit having plural memory cells connected in series and select gate transistors for coupling both ends thereof to a bit line and a source line.

7. The semiconductor memory device according to claim 1, further comprising:
a redundant circuit disposed on either one of said first and second cell arrays to relieve a defective memory cell in said first and second cell arrays.

8. The semiconductor memory device according to claim 1, further comprising:
an initial set-up data storage circuit configured to store initial set-up data, which is written into either one of said first and second cell arrays and read out to the initial set-up data storage circuit.

9. The semiconductor memory device according to claim 8, wherein the initial set-up data storage circuit comprises:
a first data register configured to store various adjustment data for adjusting memory operation conditions; and
a second data register configured to store defective address data for relieving a defective memory cell.

10. An electric device equipped with a semiconductor memory device, said device comprising:
first and second cell arrays each having electrically rewritable and non-volatile semiconductor memory cells arranged therein, said first and second cell arrays being disposed in the direction of each bit line for transferring cell data and physically independent of each other;
a sense amplifier disposed between said first and second cell arrays to be common to them; and
a decode circuit configured to select a memory cell in said first and second cell arrays in accordance with address assigned to said first and second cell arrays in such a way that said first and second cell arrays serve as one memory plane in logic; wherein
said first and second cell arrays each comprises plural blocks, each block including plural word lines, and wherein
said decode circuit comprises:
transferring transistor arrays each disposed on one side of the word line direction of a block in each of said first and second cell arrays for transferring word line drive voltages in the block;
a block decoder configured to decode block address for selectively driving one of the transferring transistor arrays;
a set of word line drivers disposed common to the entire blocks of said first and second cell arrays for outputting the word line drive voltages to be applied to word lines in a selected block; and
drive signal lines disposed for transferring the word line drive voltages from the word line drivers to the respective transferring transistor arrays.

11. A semiconductor memory device comprising:
first and second cell arrays each having electrically rewritable and non-volatile semiconductor memory cells arranged therein, said first and second cell arrays being disposed in the direction of each bit line for transferring cell data;
a redundant cell array disposed in correspondence with either one of said first and second cell arrays for relieving a defective memory cell in said first and second cell arrays;
a sense amplifier disposed between said first and second cell arrays to be common to them;
a row decoder configured to select a word line in said first and second cell arrays in accordance with address assigned to said first and second cell arrays in such a way that said first and second cell arrays serve as one memory plane in logic; and
a redundant row decoder configured to be activated in place of said row decoder in response to defective address input, thereby selecting said redundant cell array; wherein
said first and second cell arrays each comprise plural blocks, each block including plural word lines, and wherein said row decoder comprises:
transferring transistor arrays each disposed on one side of the word line direction of a block in each of said first and second cell arrays for transferring word line drive voltages in the block;
a block decoder configured to decode block address for selectively driving one of the transferring transistor arrays;
a set of word line drivers disposed common to the entire blocks of said first and second cell arrays for outputting the word line drive voltages to be applied to word lines in a selected block; and
drive signal lines disposed for transferring the word line drive voltages from the word line drivers to the respective transferring transistor arrays.

12. The semiconductor memory device according to claim 11, wherein
said sense amplifier circuit comprises:
a sense amplifier array having a plurality of sense amplifier units arranged therein, each sense amplifier unit being selectively coupled to one of bit lines in said first and second cell arrays; and
a bit line select circuit configured to select a coupling state between the sense amplifier units and bit lines in said first and second cell arrays.

13. The semiconductor memory device according to claim 11, further comprising third and fourth cell arrays disposed in the word line direction of said first and second cell arrays, respectively, said third and fourth cell arrays sharing said decode circuit with said first and second cell arrays, and wherein
said sense amplifier circuit is disposed between said third and fourth cell arrays to be common to them.

14. The semiconductor memory device according to claim 13, further comprising a plurality of memory cores, each of which is constituted by said first to fourth cell arrays, said decode circuit and sense amplifier circuit each shared by said first to fourth cell arrays.

15. The semiconductor memory device according to claim 11, wherein
each of said first and second cell arrays is formed of plural NAND cell units arranged therein, each NAND cell unit having plural memory cells connected in series and select gate transistors for coupling both ends thereof to a bit line and a source line.

16. The semiconductor memory device according to claim 11, further comprising:
an initial set-up data storage circuit configured to store initial set-up data, which have been written into either one of said first and second cell arrays and read out to the initial set-up data storage circuit.

17. The semiconductor memory device according to claim 16, wherein the initial set-up data storage circuit comprises:
a first data register configured to store various adjustment data for adjusting memory operation conditions; and
a second data register configured to store defective address data for relieving a defective memory cell.

* * * * *